United States Patent
Tran et al.

(10) Patent No.: US 6,434,060 B1
(45) Date of Patent: Aug. 13, 2002

(54) WRITE PULSE LIMITING FOR WORM STORAGE DEVICE

(75) Inventors: Lung T. Tran, Saratoga; Manish Sharma, Sunnyvale, both of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/917,882

(22) Filed: Jul. 31, 2001

(51) Int. Cl.$^7$ ................................................ G11C 7/00
(52) U.S. Cl. ............................. 365/189.07; 365/189.09
(58) Field of Search ........................ 365/189.07, 189.09

(56) References Cited

U.S. PATENT DOCUMENTS

| | | | | |
|---|---|---|---|---|
| 4,931,993 A | * | 6/1990 | Urushima | 365/189.07 |
| 5,175,707 A | * | 12/1992 | Murotani | 365/189.07 |
| 5,917,759 A | * | 6/1999 | Akashi | 365/189.07 |
| 5,959,934 A | * | 9/1999 | Chen et al. | 365/189.07 |
| 6,052,325 A | * | 4/2000 | Merritt | 365/189.07 |
| 6,069,821 A | * | 5/2000 | Jun et al. | 365/189.07 |
| 6,144,606 A | * | 11/2000 | Pan | 365/189.07 |
| 6,157,581 A | * | 12/2000 | Higashi | 365/189.07 |

* cited by examiner

*Primary Examiner*—Trong Phan

(57) ABSTRACT

A method and circuit write a memory cell. The method applies a pulse to a write line connected to the memory cell. The duration of the pulse is not predetermined. The method compares a value on the input side of the cell to a reference value. The method discontinues the pulse on the write line, in response to the comparing step, preferably if the value on the write line exceeds the reference value. The circuit comprises a pulse generator and a comparator. The pulse generator has an output and an enable input. The output is connected to a write line connected to the memory cell. The output, when enabled, carries a pulse. The comparator has two inputs and an output. One of the inputs is connected to the write line. The other of the inputs is connected to a reference. The output is connected to the write line, whereby the pulse is disabled or enabled on the write line depending upon comparator output. A complete memory system comprises an array of memory cells, a write line, and a pulse generator and comparator as described above.

19 Claims, 5 Drawing Sheets

WRITE PULSE LIMITING FOR WORM STORAGE DEVICE

RELATED APPLICATIONS

The following United States patent application contains related subject matter: Ser. No. 09/908,901, entitled "PULSE TRAIN WRITING OF WORM STORAGE DEVICE."

FIELD OF THE INVENTION

This invention relates generally to electronic memory, and more particularly to methods and circuits for writing write-once read-many (WORM) memory devices.

BACKGROUND OF THE INVENTION

In the field of memories, there is a demand for ever increasing densities and lower cost. This is especially true for non-volatile memories, i.e., those that do not lose data when power is not supplied. A non-volatile memory may be write-once-read-many ("WORM") or reprogrammable. As the name suggests, a WORM memory is written (programmed) once, and it is thereafter permanent for all practical purposes. Most WORM memories are field programmable, rather than requiring that programming be performed during manufacture. Examples of field programmable WORM memories include bipolar PROM (programmable read only memory), CMOS (complementary metal oxide semiconductor) PROM, EPROM (erasable PROM), and tunnel-junction based ROM.

WORM memories are programmed by applying a relatively large voltage to selected cells in order to alter the physical characteristics of the selected cells. The alteration mechanism depends upon the type of memory. For instance, a unit memory cell of a bipolar or CMOS PROM typically consists of one transistor in series with a fuse and/or an anti-fuse, and a PROM is programmed by applying a large voltage across the fuse or anti-fuse of the selected cells. The applied voltage causes the fuse to open or the anti-fuse to short (or both if both are present). As a result, the resistance across the cell is altered, and a reading operation can detect the alteration, as contrasted with the unaltered state, by applying a small read voltage to the cell and sensing the current flowing through the cell. As another example, a unit memory cell of a EPROM typically consists of a transistor and a floating gate, and an EPROM is programmed by applying a large potential to transfer charge from the silicon substrate to the floating gate of selected cells. The mechanism for the charge transfer in this case is Fowler-Nordheim electron tunneling.

Another example of a memory cell is an anti-fuse tunnel junction 100, which is illustrated in FIG. 1. The anti-fuse tunnel junction 100 includes a bottom electrode 120, an insulator barrier layer 140 and a top electrode 160. The bottom electrode 120 and the top electrode 160 could be conductor metals such as Cu, Al or the like or magnetic materials such as NiFe, CoFe, NiFeCo or the like. The insulator barrier layer 140 is typically very thin, from 5 Å(Angstroms) to 100 Å. Generally, the insulator barrier layer 140 is made of $TaO_x$, $AlO_x$, $SiO_x$, $SiN_x$, $AlN_x$ or the like. As a bias voltage is applied across the junction, the thin insulator barrier allows quantum mechanical tunneling to occur and a current flows from one electrode, across the barrier layer 140, to the other electrode. The resistance of the tunnel junction is exponentially dependent on the thickness of the barrier layer. Therefore, by controlling the thickness during manufacturing, the tunnel junction can be made to a desired resistance value that is suitable for a particular application.

A circuit for programming a generic WORM memory is part of a WORM memory system 200 illustrated in FIG. 2A. The WORM memory system 200 comprises an array of memory cells 210. The memory cells 210 are preferably set in a rectangular arrangement of rows and columns. Each memory cell 210 is at the intersection of a row conductor 220 and a column conductor 230. A row decoder 240 connects to the row conductors 220, and a column decoder 250 connects to the column conductors 230. Address lines (not shown) control the row decoder 240 and/or the column decoder 250 to select a desired row, column or individual cell 210. As illustrated in FIG. 1A, one particular cell 110 has been selected for writing. As part of the writing process, a write voltage $V_{WR}$ is applied across the cell 210.

A graph 260 of the write voltage $V_{WR}$ is illustrated in FIG. 2B. The write voltage $V_{WR}$ is a pulse 270 of height $V_1$ and fixed width $T_1$. For every cell 210 to be written, that cell 210 is selected through the row decoder 240 and the column decoder 250; then, the same pulse 270 is applied to the selected cell(s).

A disadvantage of WORM memories is that $V_1$ is typically required to be a high value to program the memories. In the case of an EPROM, a high voltage is needed for Fowler-Nordheim electron tunneling to occur. In the case of PROM with a polysilicon fuse as the programmable element, a large voltage is needed to deliver enough energy to blow the polysilicon fuse. In the case of a bipolar PROM with one forward and one reversed diode as a memory cell, a large voltage is needed to exceed the reverse voltage of the diode to cause it to breakdown. In the case of a WORM with a tunnel junction anti-fuse as a programmable element, the breakdown voltage of the tunnel junction is as low as 1.5 V (volts). This breakdown voltage can be controlled by the thickness of the barrier layer of the tunnel junction. A thicker barrier has a higher breakdown voltage, and a thinner barrier has a lower breakdown voltage, but these types of anti-fuse junctions exhibit significant variations in breakdown voltage.

The programming of some WORM memories exhibit significant variability from cell to cell in the required writing voltage level. This variation can result from physical variation from cell to cell in the manufacturing process. Some cells may require less energy to be programmed, while other cells may require more. In other words, the pulse 270 may be longer than necessary for some cells yet too short for other cells. To increase yield rates, the pulse duration $T_1$ is typically much longer than necessary for the vast majority of cells.

It is known in the art to verify the efficacy of a writing operation and to repeat the standard writing operation when it has been unsuccessfully attempted. Typically, the efficacy of a writing operation is tested by sensing the output voltage from a sense amplifier (not shown) connected to the output of the memory cell 110. An example of such an approach is disclosed in U.S. Pat. No. 5,684,741.

SUMMARY OF THE INVENTION

In one respect, the invention is a method for writing a memory cell. The method applies a pulse to a write line connected to the memory cell. The duration of the pulse is not predetermined. The method compares a value on the input side of the cell to a reference value. The method alters the pulse on the write line, in response to the comparing step, preferably by reducing the amplitude of the pulse and then discontinuing the pulse.

In another respect, the invention is a circuit for writing a memory cell. The circuit comprises a pulse generator, a switch and a comparator. The pulse generator has an output that is connected to a write line connected to the memory cell. The switch is on the write line. The comparator has two inputs and an output. One of the inputs is connected to the write line. The other of the inputs is connected to a reference. The comparator output is connected to the switch, whereby the pulse train is present or absent on the write line, depending upon the comparator output.

In yet another respect, the invention is a memory system. The memory system comprises an array of memory cells, a write line, and a pulse generator, a switch and comparator as described above.

As used herein, the terms "has," "have" and "having" are open-ended. Thus, for example, the pulse train generator may comprise other signal interfaces besides the output and the enable input referred to above. Furthermore, the term "connected," as used herein, means connected directly or indirectly through an intermediary element.

In comparison to known prior art, certain embodiments of the invention are capable of achieving certain advantages, including some or all of the following: (1) the writing process is more reliable; (2) elements in series with the memory cell (e.g., row and column decoders) are less likely to be damaged; (3) the writing process utilizes less power; (4) the writing time is reduced; and (5) no cross connections from the array outputs are needed, as all relevant circuitry is on only the writing side of the array. Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 2A:
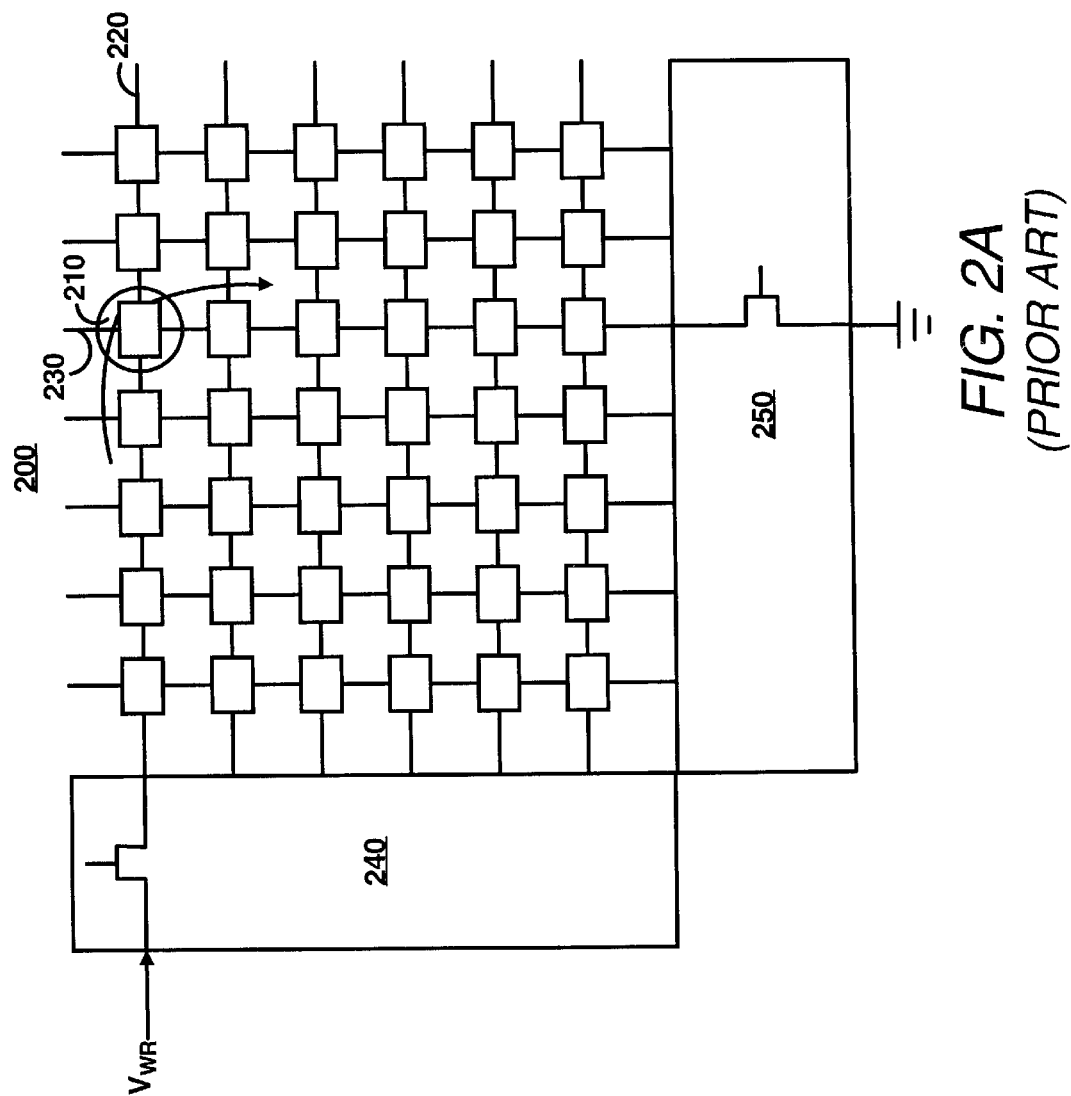
FIG. 2A illustrates a prior art circuit for programming a generic WORM memory.
Figure 3B:
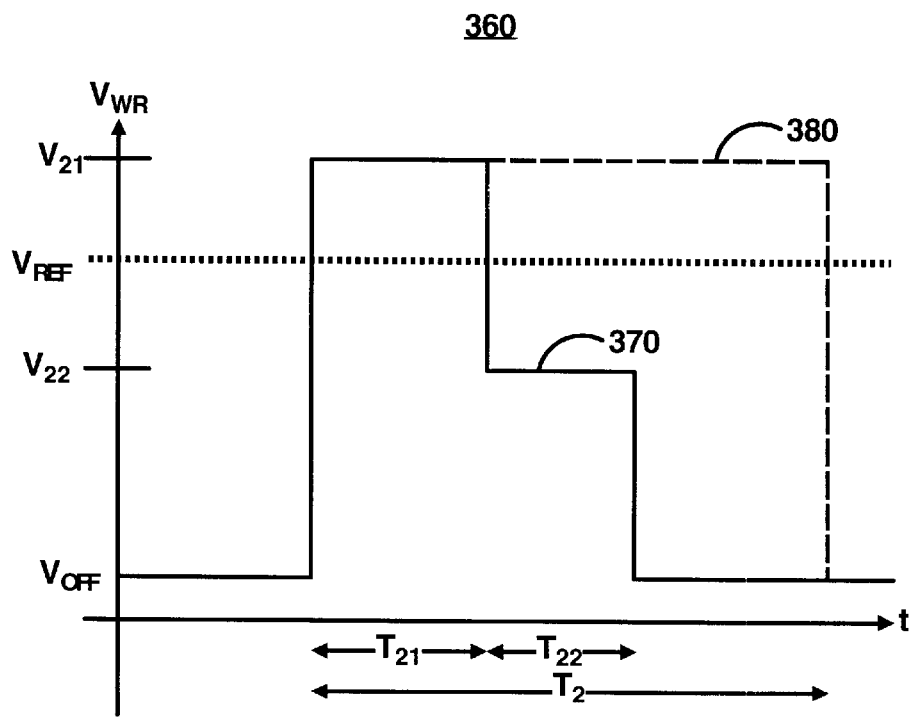
FIG. 3B is a graph of a write voltage pulse for use in the circuit of FIG. 3A.
Figure 3A:
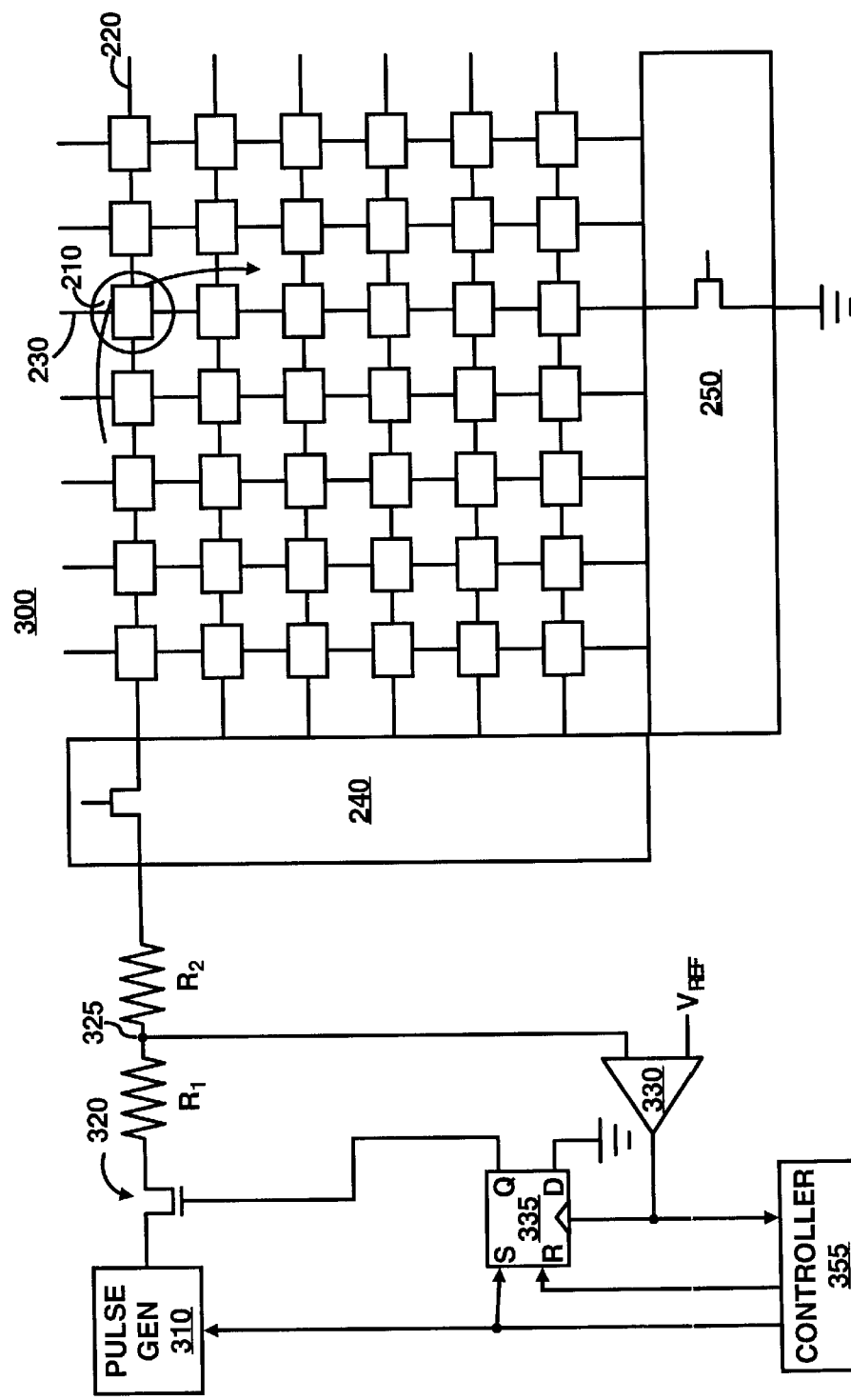
FIG. 3A illustrates a circuit for programming a WORM memory, according to an embodiment of the invention.
Figure 3C:
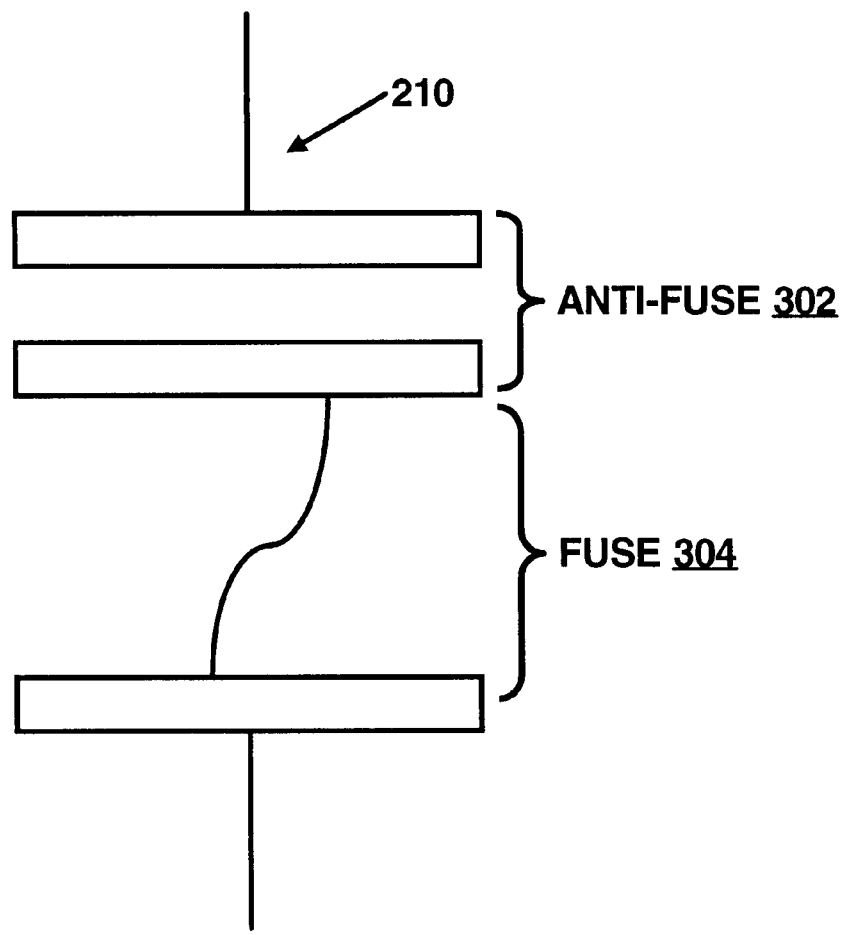
FIG. 3C is a block diagram illustrating one embodiment of a memory cell having a fuse and anti-fuse in series.

FIG. 3A illustrates a WORM memory system 300, including a circuit for programming the memory, according to an embodiment of the invention. The WORM memory system 300 comprises the same basic WORM memory as illustrated in FIG. 2A. However, the WORM memory system 300 comprises a different circuit for programming the memory. The programming circuit applies a limited pulse to the memory cell 210. In one embodiment, the memory cell 210 may include a fuse and an anti-fuse in series. As shown in FIG. 3C, the memory cell 210 may include an anti-fuse 302 and a fuse 304. In other embodiments, the memory cell may include a bipolar PROM, a CMOS PROM, an EPROM or an anti-fuse junction. Preferably, the limited pulse is a two-tier pulse. The programming circuit monitors when the writing operation is effective, so that unnecessary expenditure of energy and time is reduced.

The programming circuit includes a pulse generator 310, which connects (indirectly) to a write line for the selected memory cell 210. The write line in this case is the row conductor 220 or a line connectable (directly or indirectly) to the row conductor 220 via the row decoder 240. The labels "row" and "column" are arbitrary except as relative to each other. Therefore, in general, the write line could be the column conductor 230 or a line connectable to the column conductor 230 via the column decoder 250.

In one embodiment, the pulse generator 310 includes current source circuitry. In another embodiment, the pulse generator 310 includes voltage source circuitry with peripheral circuitry to generate a rectangular pulse at the desired pulse width, frequency and amplitude.

The output of the pulse generator 310 connects to the drain terminal of a transistor 320. The source terminal of the transistor 320 connects to a resistor $R_1$ and a resistor $R_2$ in series. The resistor $R_2$ connects to the row decoder 240. The gate terminal of the transistor 320 is an enable input. When the voltage at the gate terminal is high, the transistor 320 conducts from drain to source, allowing the pulse generator 310 output to reach the memory cell 210 (assuming the row decoder 240 and the column decoder 250 are configured to select the memory cell 210). When the voltage at the gate terminal is low, the transistor 320 "turns off" (i.e., is open between the source and drain). In alternative embodiments, the transistor 320 can be substituted by any general switch.

Between the resistors $R_1$ and $R_2$ is a node 325, which connects to an input of a voltage comparator 330. The other input of the voltage comparator 330 is connected to a reference voltage $V_{REF}$. The output of the voltage comparator 330 is high when the voltage on the node 325 exceeds $V_{REF}$; otherwise, the output of the voltage comparator 230 is low. The output of the voltage comparator 330 is connected to the clock input of an SR flip-flop 335 and input of the controller 355. When the voltage at the node 325 exceeds or drops below (depending upon how the memory cell is altered when written) $V_{REF}$, the output of the voltage comparator 330 changes from high to low and causes the Q output of the SR flip-flop 335 to turn off the transistor 320. The controller 355 also senses the change at the node 325 via the voltage comparator 330 and, in turn, shuts off the pulse generator 310 output on the write line for the memory cell 210.

If writing a cell causes its resistance to decrease, then the voltage at the node 325 will fall when the writing operation completes. If writing a cell causes its resistance to increase (as would be the case with a fuse type memory cell), then the voltage at the node 325 will rise when the writing operation completes. In either case, one skilled in the art can easily set $V_{REF}$ and the polarity of the comparator 330 to distinguish between the pre-writing and post-writing conditions. If an attempt to write a cell does not change the cell's resistance, the controller 355 turns off the pulse generator 310 and brings the gate of the transistor 320 to a low state via the R terminal of the SR flip-flop 335. The slew rate of the voltage comparator 330 is preferably fast enough to detect the change in voltage at the node 325 so that the circuitry can respond in an appropriate manner with little delay.

The resistors $R_1$ and $R_2$ act as a voltage divider. Preferably, both $R_1$ and $R_2$ are small resistors, so that the write pulse is not too severely attenuated. One skilled in the art can choose $R_1$ and $R_2$ for proper operation in conjunction with the comparator 330, the memory cell 210 and the other circuitry of the memory system 300.

In an alternative embodiment, the voltage divider formed by $R_1$ and $R_2$ could be replaced by a current shunting arrangement, and the voltage comparator 330 could be replaced by a current comparator (connected to a reference current $I_{REF}$, rather than a reference voltage $V_{REF}$). Such an alternative circuit can detect current changes on the input side of the memory cell 210 as a result of successful writing of the cell 210. The details of such an alternative is within the ordinary skill in the art.

Figure 2B:
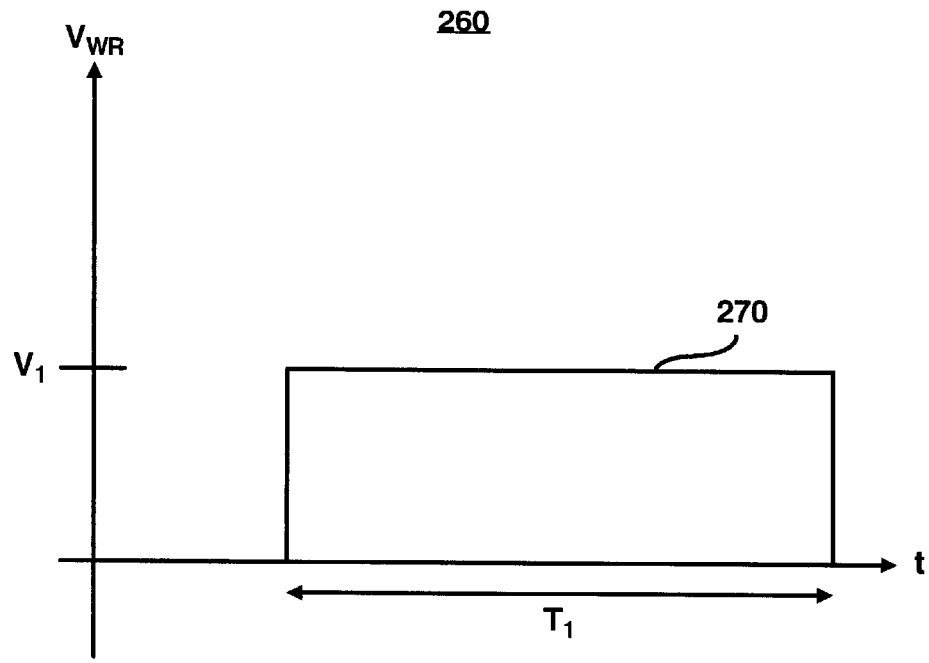
FIG. 2B is a graph of a write voltage pulse for use in the circuit of FIG. 2A.

FIG. 3B is a graph 360 of an effective write voltage pulse 370 and an ineffective write voltage pulse 380, both for use in the programming circuit of FIG. 3A. The effective write voltage pulse 370, illustrated as a "Utah" shaped pulse with solid outline, is the voltage at the node 325 in the case when the memory cell 210 is written successfully. The effective write voltage pulse 370 is a two-tier pulse of height V21 for an interval T21 then height V22 for an interval T22. The overall width of the effective write voltage pulse 370 is T21+T22, which is a variable, is preferably much narrower than T1, the width of the conventional write pulse 270 (FIG. 2B). The interval T21 is the time required for writing a cell to complete. When the writing operation completes, the voltage decreases below VREF, causing the voltage comparator 330, SR flip-flop 335 and controller 355 to shut off the transistor 320 and the pulse generator 310. The interval T22 is the time required for the circuitry to respond in this way. The interval T22 is preferably substantially soon or as short as possible. In a best case, only enough pulse energy necessary to write a cell is applied to the cell and then quickly turned off. In this way, the effective write voltage pulse 370 is most often shorter (usually considerably shorter) than the conventional write pulse 270. Because the interval T21 can vary from cell to cell, different length pulses may be applied to different memory cells. In this way, the programming circuit of FIG. 3B self-adjusts to each cell.

The ineffective write voltage pulse 380, shown as a rectangular pulse partially in dashed outline, is the voltage at the node 325 when an attempt to write the memory cell 210 is unsuccessful. In this case, the controller 355 disables the pulse after a predetermined time $T_2$, which is a time that with a certain high probability would be sufficient to write the memory cell 210, if it were not defective. Thus, the predetermined time $T_2$ is an upper limit on the maximum duration of any writing operation.

The values of $V_{21}$, $V_{22}$, $V_{REF}$ and $T_2$ are dependent upon the physics of the memory cell 110. The voltage $V_{21}$ should carry sufficient energy to effectuate writing, but not so much energy that other circuitry (e.g., the row decoder 240 or the column decoder 250) is damaged. The reference voltage $V_{REF}$ is chosen to be some value between $V_{21}$ and $V_{22}$ (i.e., $V_{21}<V_{REF}<V_{22}$). Given a particular memory cell 110, one skilled in the art can pick suitable values for $V_{21}$, $V_{22}$ (and thus $R_1$ and $R_2$) and $T_2$. Given $V_{21}$, and $V_{22}$, $V_{REF}$ can be suitably chosen.

Although the pulses 370 and 380 are illustrated in FIG. 3B as having perfectly square edges, that is an ideal form. The pulses 370 and 380 typically have exponential rises and falls between levels. In fact, in full generality, the shape of the pulses is arbitrary. The multiple levels, if any, of the pulse 370 merely represent different energy levels.

Figure 1:
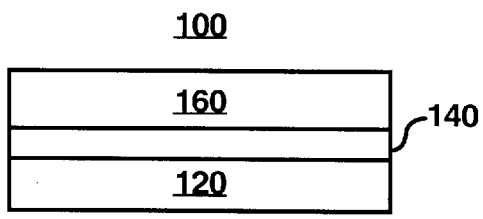
FIG. 1 depicts a tunnel junction anti-fuse memory cell.
Figure 4:
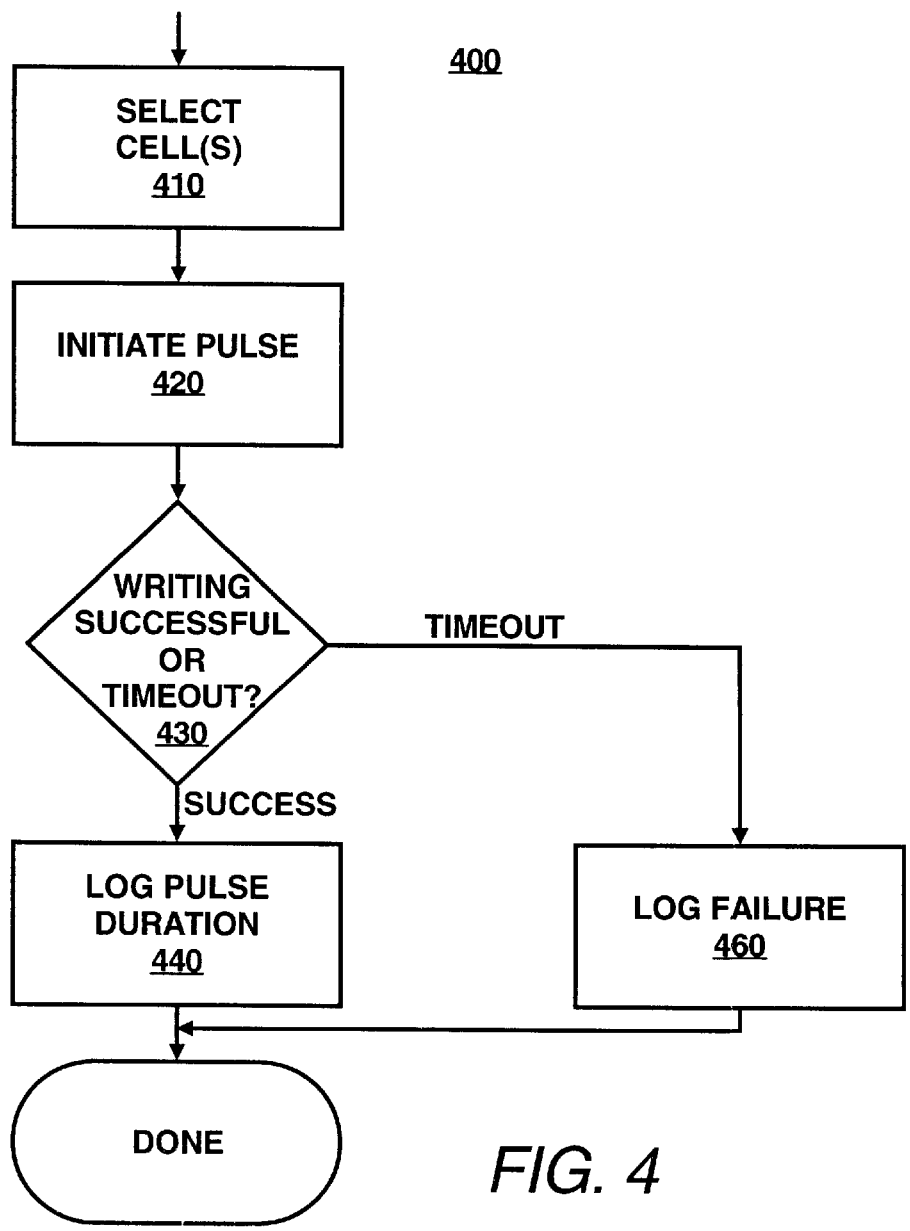
FIG. 4 is a flow chart of a method, according to an embodiment of the invention.

FIG. 4 is a flow chart of a method 400, according to an embodiment of the invention. The method 400 selects (410) one or more cells (e.g., an entire row) to be written. The method 400 initiates (420) a pulse to the selected cell(s). The initiating step 420 turns on the pulse 370 or a similar pulse. Next, the method 400 monitors (430) whether the writing has been successful or not. The monitoring step 430 is preferably performed by monitoring the input side of the cell, rather than sensing the cell output. If and when the writing is successful, then the method 400 optionally logs (440) the fact that the write was successful and/or the duration of the pulse. The duration is a measure of the quality of the cell and of the memory system generally. The logged data may be used at a later time for device screening or statistical analysis. If the writing is not successful according to the monitoring step 430, then the pulse has timed-out and the method 400 optionally logs (460) a failure to write the cell.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for writing a memory cell, the method comprising:

initiating a pulse on a write line connected to the memory cell;

comparing a reference value to a value on an input side of the memory cell; and altering the pulse on the write line, in response to comparing the reference value to the value on the input side of the memory cell.

2. The method of claim 1 wherein the pulse is a multi-tier pulse.

3. The method of claim 1 wherein the memory cell comprises a fuse and an anti-fuse in series.

4. The method of claim 1 wherein the memory cell is selected from the group consisting of a bipolar PROM, a CMOS PROM, an EPROM and an anti-fuse tunnel junction.

5. The method of claim 1 wherein the reference value and the value on the input side of the cell are voltages.

6. The method of claim 1 wherein the value on the input side of the cell is a value on the write line.

7. The method of claim 1 wherein altering the pulse comprises:

reducing the amplitude of the pulse.

8. The method of claim 7 wherein the duration of the pulse is not predetermined and wherein altering the pulse further comprises:

discontinuing the pulse on the write line some time after the reducing step.

9. The method of claim 8 wherein said some time is substantially soon.

10. The method of claim 1 wherein altering the pulse further comprises:

discontinuing the pulse on the write line, in response to comparing the reference value to the value on the input side of the memory cell.

11. The method of claim 1 further comprising:

discontinuing the pulse on the write line after a predetermined maximum time.

12. A circuit for writing a memory cell, the circuit comprising:
   a pulse generator having an output, the output connected to a write line connected to the memory cell, the output being a pulse; and
   a switch on the write line;
   a comparator having two inputs and an output, one of the inputs connected to the write line, the other of the inputs connected to a reference, the output connected to the switch, whereby the pulse is present or absent on the write line depending upon the comparator output.

13. The circuit of claim 12 further comprising:
   a controller connected to the comparator and the pulse generator.

14. The circuit of claim 13 further comprising:
   a flip-flop having a clock input and an output, the clock input being connected to the output of the comparator, the flip-flop output being connected to the switch.

15. The circuit of claim 14 wherein the flip-flop has a set input and a reset input, both connected to the controller.

16. The circuit of claim 12 wherein the switch is a transistor.

17. The circuit of claim 12 further comprising:
   a voltage divider on the write line, wherein an intermediate node in the voltage divider is connected to the comparator input.

18. A memory system comprising:
   an array of memory cells;
   a write line connectable to at least one of the memory cells in the array;
   a pulse generator having an output, the output connected to the write line, the output being a pulse;
   a switch on the write line;
   a comparator having two inputs and an output, one of the inputs connected to the write line, the other of the inputs connected to a reference, the output connected to the switch, whereby the pulse is present or absent on the write line depending upon the comparator output.

19. The memory system of claim 18 further comprising:
   a row decoder connected to the array; and
   a column decoder connected to the array.

* * * * *